(12) United States Patent
Ishikawa

(10) Patent No.: US 9,184,561 B2
(45) Date of Patent: Nov. 10, 2015

(54) METHOD TO DETERMINE OPERATING CONDITIONS OF WAVELENGTH TUNABLE LASER DIODE AND TO CONTROL OPTICAL TRANSMITTER PROVIDING WAVELENGTH TUNABLE LASER DIODE

(71) Applicant: Sumitomo Electric Industries, Ltd., Osaka-shi (JP)

(72) Inventor: Tsutomu Ishikawa, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/500,194

(22) Filed: Sep. 29, 2014

(65) Prior Publication Data

US 2015/0092798 A1 Apr. 2, 2015

(30) Foreign Application Priority Data

Sep. 30, 2013 (JP) .................. 2013-204813

(51) Int. Cl.
*H01S 5/06* (2006.01)
*H01S 5/068* (2006.01)
*H01S 5/024* (2006.01)
*H01S 5/026* (2006.01)
*H01S 5/12* (2006.01)

(52) U.S. Cl.
CPC ........... *H01S 5/06808* (2013.01); *H01S 5/0261* (2013.01); *H01S 5/02453* (2013.01); *H01S 5/0612* (2013.01); *H01S 5/1209* (2013.01); *H01S 5/1212* (2013.01)

(58) Field of Classification Search
CPC ... H01S 5/0612; H01S 5/1209; H01S 5/1212; H01S 5/0261
See application file for complete search history.

(56) References Cited

U.S. PATENT DOCUMENTS

2008/0247707 A1* 10/2008 Fujii .............................. 385/14
2009/0168817 A1* 7/2009 Ishikawa et al. ................ 372/20

FOREIGN PATENT DOCUMENTS

JP 2008-277758 A 11/2008

* cited by examiner

*Primary Examiner* — Joshua King
(74) *Attorney, Agent, or Firm* — Venable LLP; Michael A. Sartori; F. Brock Riggs

(57) ABSTRACT

A method to control a wavelength tunable laser diode (tunable LD) is disclosed. The tunable LD includes a SG-DFB region and a CSG-DBR region to tune the emission wavelength thereof. The CSG-DBR region includes three segments, where the refractive indices of respective segments are variable by heaters provided therein. When the electrical power supplied to two segments is optionally selected, the power supplied to the rest segment is corrected by an offset from a value reflecting physical dimensions of the heaters. The offset is determined such that the tunable LD shows the best side mode suppression ratio (SMSR).

5 Claims, 9 Drawing Sheets

METHOD TO DETERMINE OPERATING CONDITIONS OF WAVELENGTH TUNABLE LASER DIODE AND TO CONTROL OPTICAL TRANSMITTER PROVIDING WAVELENGTH TUNABLE LASER DIODE

BACKGROUND OF THE INVENTION

1. Field of the Invention

The present invention relates to a method to determine operating conditions of a wavelength tunable laser diode (hereafter denoted as a tunable LD) and to control an optical transmitter implementing the tunable LD.

2. Background Arts

One type of diffraction gratings has been well known in the field as the sampled grating where a plurality of segments is continuously formed, each of segments includes a diffraction grating and a space with no diffraction grating formed continuously next to the diffraction grating. The sampled grating inherently has a function to select a wavelength. For instance, a sampled grating with an optical gain, which is called as the SG-DFB (sampled grating distributed feedback), may be integrated with a sampled grating without any optical gain but showing wavelength selective reflectivity to select one specific wavelength, which is called as the SG-DBR (sampled grating distributed Bragg reflector). Various prior arts have disclosed a tunable LD having the SG-DFB and the SG-DBR. In particular, one type of the SG-DBRs including a chirped sampled grating distributed Bragg reflector, which is called as CSG-DBR, combined with the SG-DFB has been well known in the field.

In the SG-DFB and/or the SG-DBR, the diffraction gratings in respective segments are formed so as to align the phases thereof. However, some reasons, for instance, the instability of the manufacturing process of the diffraction grating and/or the stress induced in the segments, sometimes disorder the phase of the diffraction grating in respective segments within dimensions less than a period of the diffraction gratings. Another reason such as inhomogeneous distribution of the temperature and/or the temperature deviated from the designed one cause undesired variation of the equivalent refractive index in the segment, which also disorders the optical interaction between the SG-DFB and the SG-DBR. The present application is to provide a solution to compensate such deviation.

SUMMARY OF THE INVENTION

An aspect of the present application relates to a method to tune an emission wavelength of a tunable LD that provides the SG-DFB region and the CSG-DBTR region to tune the emission wavelength of the tunable LD. The CSG-DBR region has at least three segments each formed by a diffraction grating and a space, where the space has no diffraction grating and provided next to the diffraction grating. The segments have respective optical lengths, L1 to L3 and heaters, wherein the optical lengths satisfying a relation of:

$$L1=L3+(L2-L3)\times K(0.3<=K<=0.7).$$

The method of the application includes a step of supplying power, P1 to P3, to respective heaters of the segments, where the power, P1 to P3, satisfies a relation of:

$$P1=P3 \cdot Rth3/Rth1+(P2 \cdot Rth2/Rth1-P3 \cdot Rth3/Rth1)\times K+ Poffset,$$

where Rth1 to Rth3 are thermal resistance of respective heaters, and Poffset is optimum offset power. Because the power supplied to the first heater is adjusted by the optimum offset power Poffset, the disorder of the diffraction gratings between segments may be compensated.

The method may further include, in advance to the practical operation of the tunable LD, steps of: selecting offset power; determining a wavelength tunable range for the selected offset power as evaluating a maximum side mode suppression ratio (SMSR) at emission wavelengths as varying a combination of power, P1 to P3, supplied to the heaters, and determining the optimum offset power Poffset as the offset power at which the wavelength tunable range becomes a maximum.

A modification of the method to tune an emission wavelength of a tunable LD includes a step of supplying power, P1 to P3, to respective heaters of the segments, wherein the power, P1 to P3, satisfies a relation of:

$$P1=P3 \cdot Rth3/Rth1+(P2 \cdot Rth2/Rth1-P3 \cdot Rth3/Rth1)\times(1+ Kopt),$$

where Rth1 to Rth3 are thermal resistance of respective heaters, and Kopt is optimum correction factor. Because the power supplied to the first heater is adjusted by the optimum correction factor Kept, the disorder of the diffraction gratings between segments may be compensated.

The modified method may further include, in advance to the practical operation of the tunable LD, steps of: selecting a correction factor Kp; determining a wavelength tunable range for the selected correction factor Kp as evaluating a maximum side mode suppression ratio (SMSR) at emission wavelengths as varying a combination of power, P1 to P3, supplied to the heaters, and determining the optimum correction factor Kopt as the correction factor Kp at which the wavelength tunable range becomes a maximum.

Another aspect of the preset application relates to a method to control an optical transmitter that provides a wavelength tunable laser diode (tunable LD), a controller, and a memory look-up-table (LUT). The tunable LD has a sampled grating distributed feedback (SG-DFB) region and a chirped sampled grating distributed Bragg reflector (CSG-DBR) region integrally formed with the SG-DFB region. The CSG-DBR region includes at least three segments each having a diffraction grating and a space neighbor to the diffraction grating. Each of the segments has a heater and an optical length satisfying a relation of:

$$L1=L3+(L3-L2) \cdot K,$$

where L1 to L3 are respective optical lengths of the segments and K is a constant of $0.3<=K<=0.7$ reflecting physical dimensions of the segments. The method comprising steps of:
(a) evaluating parameters to define an emission wavelength of the tunable LD. The parameters includes currents supplied to respective heaters, optimum offset power supplied to the heater in the first segment, and an operating temperature of the tunable LD.
(b) Storing the parameters to the memory LUT, and
(c) Practically operating the tunable LD by performing steps of,
(c1) receiving a target emission wavelength at which the tunable LD emits laser light,
(c2) reading parameters corresponding to the target emission wavelength from the memory LUT, and
(c3) controlling respective elements based on the parameters.

A feature of the method is that the step of evaluating the parameters includes steps of,
(a1) varying power, P1 to P3, supplied to respective heaters based a relation of, $$P1=P3 \cdot Rth3/Rth1+(P2 \cdot Rth2/Rth1-P3 \cdot Rth3/Rth1)+ Poff,$$

where Rth1 to Rth3 are thermal resistance of respective heaters and Poff is offset power supplied to the heater in the first segment;

(a2) measuring an emission wavelength and a side mode suppression ratio (SMSR) at the emission wavelength for the offset power;

(a3) evaluating a wavelength tunable range of the tunable LD, where the wavelength tunable range is a range the SMSR exceeds a preset value;

(a4) iterating the steps of varying power, measuring the emission wavelength and the SMSR, and the evaluating the wavelength tunable range as varying the offset Poff;

(a5) determining the optimum offset power at which the wavelength tunable range becomes a maximum.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiments according to the present invention will be described as referring to drawings.

First Embodiment

Figure 1:
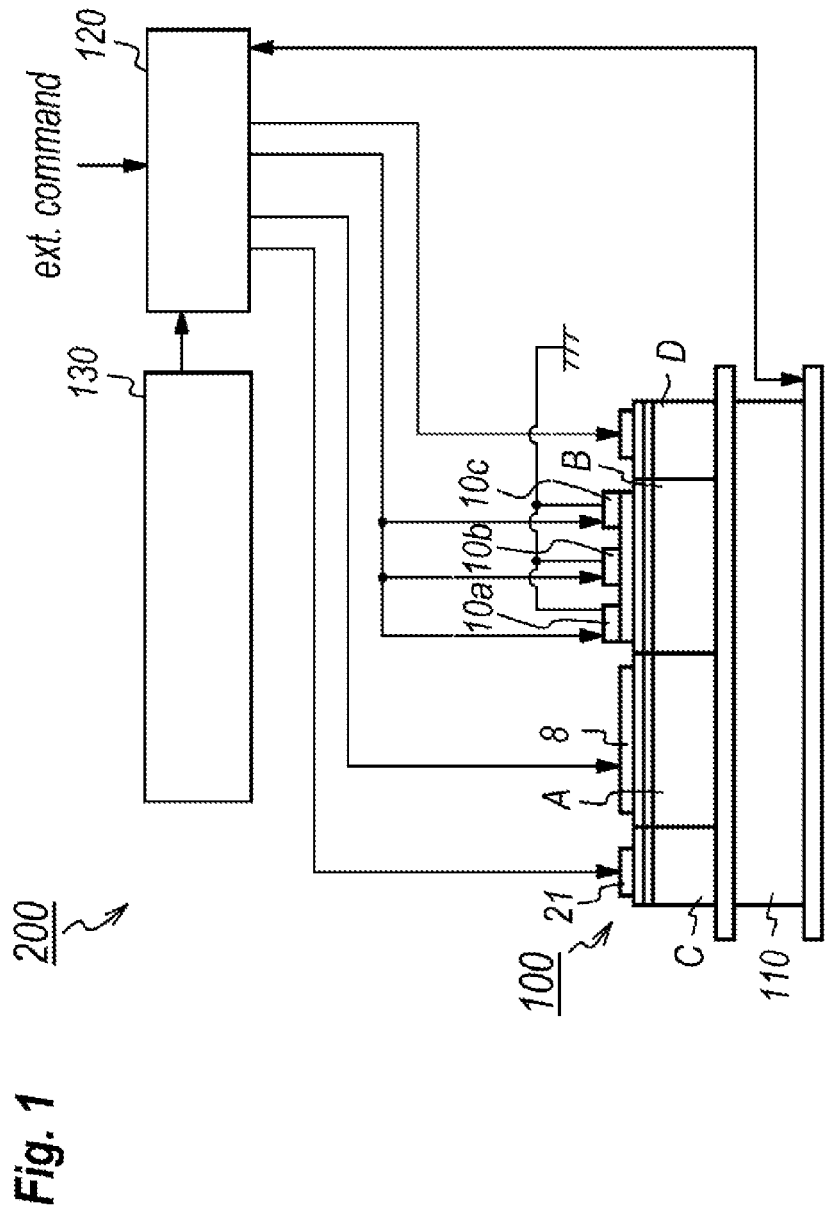
FIG. 1 schematically illustrates an optical transmitter including a tunable LD.

FIG. 1 schematically illustrates an optical transmitter 200 implementing a wavelength tunable laser diode (tunable LD) 100. The optical transmitter 200 primarily includes the tunable LD 100, a thermo-electric cooler (TEC) 110 to mount the tunable LD 100, a controller 120, and so on. The controller 120 includes a central processing unit (CPU), a random access memory (RAM), a read only memory (ROM), and so on to drive or operate the tunable LD 100. The ROM and the RAM in the controller 120 stores control parameters and programs for the tunable LD 100. The control parameters are stored in the RAM or the ROM as a look-up-table (LUT) 130.

Figure 2:
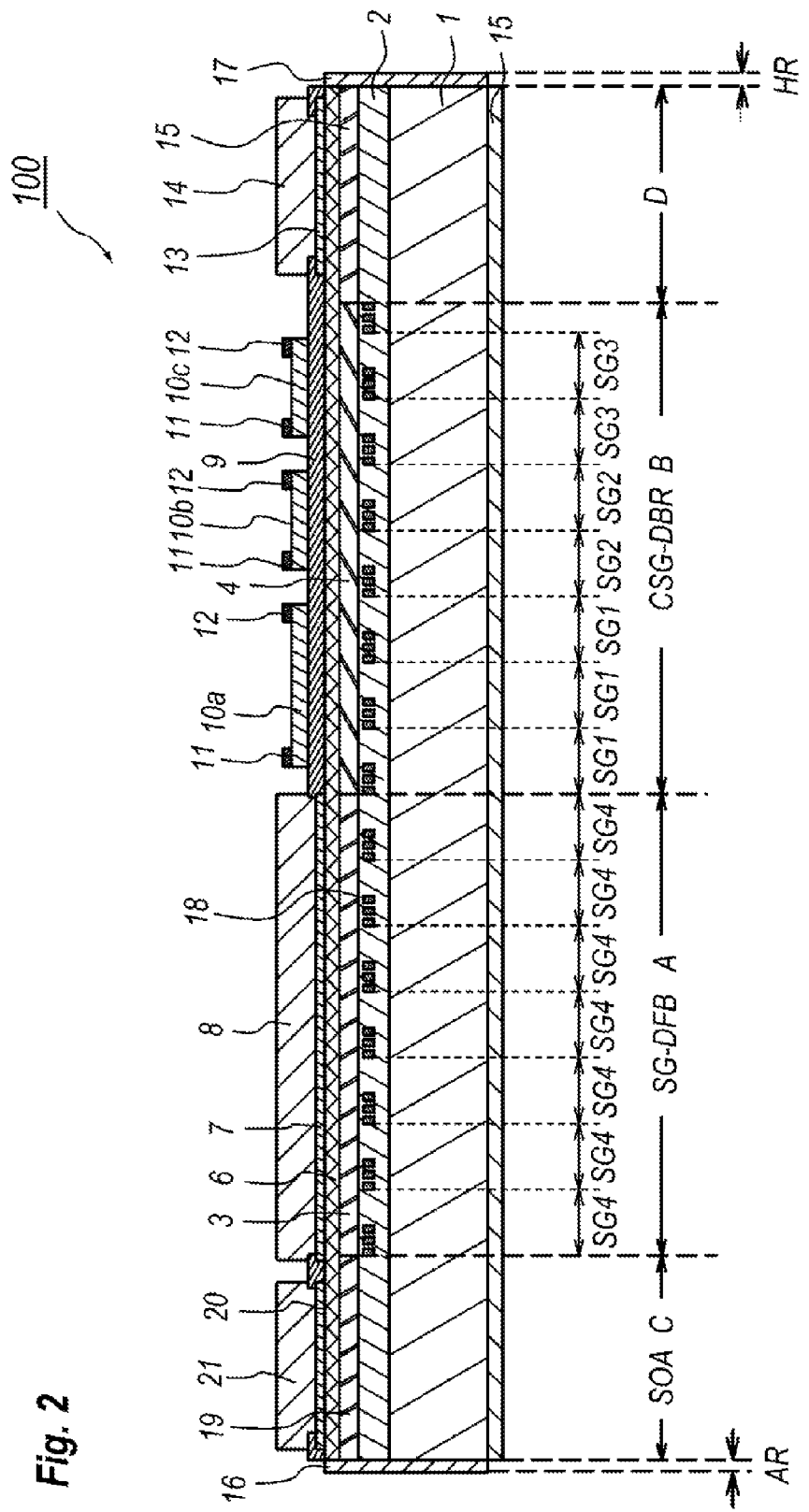
FIG. 2 is a cross section of the tunable LD shown in FIG. 1.

FIG. 2 schematically illustrates a cross section, exactly, a longitudinal cross section of the tunable LD 100 along the optical axis thereof. The tunable LD 100 of the embodiment provides a sampled grating distributed feedback (SG-DFB) region A, a chirped sampled grating distributed Bragg reflector (CSG-DBR) region B, a semiconductor optical amplifier (SOA) region C, an absorption region D, an anti-reflection film AR, and a high-reflection film HR. One typical arrangement of those regions in the tunable LD 100 is, from a side where the AR film is provided to another side, the AR film, the SOA region C, the SG-DFB region A, the CSG-DBR region B, the absorption region D, and the HR film. In the description below, the side of the AR film is sometimes called as the front; on the other hand, the side of the HR film is called as the rear. The SG-DFB region A inherently shows an optical gain and has a sampled grating. The CSG-DBR region B also has the sampled gating but shows no optical gain. The SOA region C operates as an optical amplifier.

The SG-DFB region A includes, on a substrate 1, a lower cladding layer 2, an active layer 3, an upper cladding 6, a contact layer 7, and electrodes 8. The CSG-DBR region B includes, also on the substrate 1, the lower cladding layer 2, a waveguide layer 4, an upper cladding layer 6, an insulating film 9, and a plurality of heaters, 10a6~10c, accompanied with power supply electrodes 11 and ground electrodes 12. The SOA region C includes, also on the substrate 1, the lower cladding layer 2, an amplifying layer 19, the upper cladding layer 6, and a contact layer 13 accompanied with an electrode 21. The absorption layer D includes, on the substrate 1, the lower cladding layer 2, an absorption layer 5, the upper cladding layer 6, and a contact layer 13 accompanied with an electrode 14. Under a practical operation of the tunable LD 100, the electrode 14 is short-circuited to the back electrode 15 to absorb carriers generated in the absorption layer 5.

The substrate 1 is common to all regions. That is, the SOA region C, the SG-DFB region A, the CSG-DBR region B, and the absorption region D are formed on the common substrate 1. Moreover, the lower cladding layer 2 and the upper cladding layer 6 are also common to those regions, A to D. The active layer 3 in the SG-DFB region A, the waveguide layer 4 in the CSG-DBR region B, the absorption layer 5 in the absorption region C, and the amplifying layer 19 in the SOA region C have bottom interfaces against the lower cladding layer 2 common to all regions, A to D. That is, the top interface of the lower cladding layer 2 is common to all regions, A to D, or substantially in a level common to all regions, A to D. The interface between the SG-DFB region A and the CSG-DBR region B corresponds to an interface between the active layer 3 in the SG-DFB region A and the waveguide layer 5 in the CSG-DBR region B.

The AR film 16 extends from the substrate 1 to the upper cladding layer 6 in the front end of the SOA region C. The HR film also extends from the substrate 1 to the upper cladding layer 6 in the rear end of the absorption region D.

In the tunable LD 100 of the embodiment, the substrate 1, the lower cladding layer 2, and the upper cladding layer 6 are made of n-type InP, n-type InP, and p-type InP, respectively. The lower and upper cladding layers, 2 and 6, optically confine light against the active layer 3, the waveguide layer 4, the absorption layer 5, and the amplifying layer 19.

The active layer 3 may have a quantum well structure. In the present embodiment, the active layer 3 includes well layers made of $Ga_{0.32}In_{0.68}As_{0.92}P_{0.08}$ each having a thickness of 5 nm, and barriers layers made of $Ga_{0.22}In_{0.78}As_{0.47}P_{0.53}$ each having a thickness of 10 nm. The well layers and the barrier layers are alternately stacked to each other. The waveguide layer 4 has bandgap energy greater than that of the active layer 3.

The absorption layer 5 is made of semiconductor material showing substantial absorption at the emission wavelength of the tunable LD 100. Specifically, the semiconductor material for the absorption layer 5 has the bandgap wavelength longer than the emission wavelength of the tunable LD 100, where the bandgap wavelength corresponds to the fundamental absorption edge of the semiconductor material. Also, the absorption layer 5 may have the MQW structure having, for instance, well layers made of $Ga_{0.47}In_{0.53}As$ each having a thickness of 5 nm and barrier layers made of $Ga_{0.28}In_{0.72}As_{0.61}P_{0.69}$ each having a thickness of 10 nm alternately stacked to each other. In an alternate, the absorption layer 5 may be a bulk layer made of $Ga_{0.46}In_{0.54}As_{0.98}P_{0.02}$. Still in another alternate, the absorption layer 5 may have an arrangement same with the active layer 3 in the SG-DFB region A. In such an arrangement, the absorption layer 5 may be formed concurrently with the active layer 3, which may simplify the process to from the tunable LD 100.

The amplifying layer 19 may show the optical gain by carriers injected from the electrode 21. The amplifying layer 19 may have the MQW structure alternately stacking the well layers made of $Ga_{0.35}In_{0.65}As_{0.99}P_{0.01}$ each having a thickness of 5 nm and barrier layers made of $Ga_{0.0}In_{0.85}As_{0.32}P_{0.68}$ each having a thickness of 10 nm. In an alternate, the amplifying layer 19 may have a bulk structure made of $Ga_{0.44}In_{0.56}As_{0.95}P_{0.05}$. Similar to the absorption layer 5, the amplifying layer 19 may have an arrangement same with the active layer 3 in the SG-DFB region A for simplifying the manufacturing process of the tunable LD 100.

The contact layers, 7, 13, and 20, are made of p-type $Ga_{0.47}In_{0.53}As$. The insulating film 9 may be made of inorganic material, typically silicon nitride (SiN) and/or silicon oxide ($SiO_2$). Heaters, 10a to 10c, may be a type of a thin film resistor made of, for instance, alloy of nickel (Ni) and chromium (Cr), which is called as nichrome (NiCr). Each of the heaters, 10a to 10c, extends over segments, where one segment includes one diffraction grating and a space next to the diffraction grating but providing no diffraction gratings. Details of the segment will be described later in this specification.

The top electrodes, 8, 21, and 14, in the SG-DFB region A, the SOA region C, and the absorption region D; the power supply electrodes 11 and the ground electrodes 12 in the CSG-DBR region B may be a multi-layered metal stack. While, the back electrode 15 may be also a multi-layered metal stack metal and extends from the SOA region C to the absorption region D.

The AR film 16 has the reflectivity less than 1.0%, that is, the AR film 16 operates substantially as an anti-reflection film. The AR film 16 may be made of a multi-layered dielectric film including alternately stacked $MgF_2$ films and TiON films. On the other hand, the HR film 17 shows the reflectivity greater than 10%, around 20% in the present embodiment, to suppress light from leaking out therefrom. The HR film 17 may have a multi-layered structure of alternating $SiO_2$ and TiON three times. The reflectivity of the AR film 15 and that of the HR film 17 correspond to the light outgoing from the inside of the tunable LD 100. The HR film 17 accompanied with the reflectivity greater than 10% for the outgoing light means that the HR film 17 shows the substantial reflectivity for the incoming light from the external. The incoming light from the external, which is often called as stray light, may be effectively suppressed from entering the inside of the device 100. Moreover, the absorption region D may effectively absorb such stray light in the absorption layer 5 so as not to reach the resonance cavity of the SG-DFB region A and the CSG-DBR region B.

The diffraction grating 18 includes corrugations formed in the lower cladding layer 2 in the SG-DFB region A and the CSG-DBR region B. The diffraction grating whose corrugations are formed intermittently comprises the sampled grating in respective regions, A and B. As described, the diffraction grating 18 accompanied with the neighbor space with no diffraction gratings form one segment. In other words, the one segment comprises a region connecting one space disposed between the gratings with the one of the gratings next to the space. The diffraction grating 18 is made of material with refractive index different from the refractive index of the lower cladding region 2. One example of the diffraction grating 18 is made of $Ga_{0.22}In_{0.78}As_{0.47}P_{0.53}$ for the lower cladding region 2 made of InP.

The diffraction grating 18 is formed by the interference exposure technique using two laser beams. The space between the diffraction grating 18 may be formed by further exposure without any periodic patterns after the interference exposure but before the deposition of the photoresist. The diffraction grating 18 in the SG-DFB region A of the present embodiment have a pitch between two corrugations neighbor to each other same as a pitch of the neighbor corrugations of the diffraction grating 18 in the CSG-DBR region B. However, the tunable LD 100 may have the pitch between the neighbor corrugations in the SG-DFB region A different from the pitch between the neighbor corrugations in the CSG-DBR region B. Moreover, the diffraction grating has a length substantially homogeneous in respective segments, or the diffraction gratings 18 have respective lengths specific thereto and different from others. Or, the SG-DFB region A has the segments each having the diffraction grating with the first length, while, the CSG-DBR region B has the segments each having the diffraction grating with the second length different from the first length. The present embodiment shown in FIG. 2 provides the diffraction gratings 18 having a length of about 4 µm, which is common to the SG-DFB region A and the CSG-DBR region B.

Moreover, in the CSG-DBR region B, at least one of segments has an optical length different from rest of segments, which may modify wavelength dependence of the envelope of the periodic reflectance spectrum attributed to the CSG-DBR region B. Specifically, the CSG-DBR region B of the embodiment provides seven (7) segments, that is, from the side of the SG-DFB region A, three segments SG1 having the first optical length, two segments SG2 having the second optical length, and two segments SG3 having the third optical length, where the first to third optical lengths are different from others. Moreover, in the present embodiment, the first to third optical lengths are roughly 180 µm but precisely different from others.

Assuming that the optical lengths of the first to third segments to be, L1, L2, and L3, respectively, the tunable LD 100 of the embodiment sets the relation of:

$$L1=L3+(L2-L3)\times K, \tag{1}$$

where K is a constant satisfying a condition of 0.3=<K<=0.7. When K is set to be 0.5, the relation (1) becomes:

$$L1=(L2+L3)/2.$$

The embodiment shown in FIG. 2 provides seven (7) segments in the SG-DFB region A each having an optical length SG4 common to all segments. For instance, the segments SG4 may have the optical length of about 160 µm. These four types of the segments, SG1 to SG4, in the CSG-DBR region B and the SG-DFB region A form a cavity in the tunable LD 100 to determine the emission wavelength.

A tunable LD like the embodiment shown in FIG. 2 may have a structure to match the phase of a beam advancing the front with another beam advancing the rear by shifting the phase between two beams by 90°. The tunable LD 100 of the present embodiment provides the phase shift region in the segment SG4 of the SG-DFB region A closest to the CSG- DBR region B. This segment SG4 may provide a region in the space where the waveguide narrows or expands a width thereof, or a diffraction grating in a portion thereof shifting the phase of the corrugations.

The CSG-DBR region B arranges three heaters, 10a to 10c, in respective segments, SG1 to SG3. The first heater 10a covers the first three segments SG1, the second heater 10b is disposed above the second segments SG2, and the third heater 10c covers the final two segments SG3. Each of the heaters, 10a to 10c varies temperatures of respective segments, SG1 to SG3, independently.

Next, the mechanism to operate the optical transmitter 200 will be described. The controller 120 first acquires, referring to the LUT 130, the initial bias current $I_{LD}$ for the electrode 8 in the SG-DFB region A, the initial supply current $I_{SOA}$ for the SOA C, initial heater currents, $I_{Heater\_A}$ to $I_{Heater\_C}$, and the initial temperature $T_{LD}$ corresponding to the target emission wavelength or the target channel/grid with the specific wavelength. Table 1 below shows an example of the LUT 130.

TABLE 1

Example of LUT

| Ch | $I_{LD}$ [mA] | $I_{SOA}$ [mA] | $I_{Heater\_A}$ [mA] | $I_{Heater\_B}$ [mA] | $I_{Heater\_C}$ [mA] | $T_{LD}$ [° C.] |
|---|---|---|---|---|---|---|
| 1 | 100 | 51.0 | 31.8 | 20.5 | 12.0 | 21.23 |
| 2 | 100 | 49.0 | 32.1 | 25.3 | 16.7 | 30.52 |
| 3 | 100 | 48.5 | 34.2 | 32.2 | 30.8 | 32.54 |
| . | . | . | . | . | . | . |
| . | . | . | . | . | . | . |
| . | . | . | . | . | . | . |
| n | 100 | 50.0 | 32.2 | 37.5 | 45.6 | 33.33 |

The controller 120 supplies the initial current $I_{LD}$ to the electrode 8, which generates light in the active layer 3 of the SG-DFB region A. The light thus generated in the active layer 3 is amplified during the propagation in backward and forward between the SG-DFB region A and the CSG-DBR region B by reflecting at respective segments, which causes a plurality of gain peaks with a specific interval in the SG-DFB region A and a plurality of reflection peaks with another specific interval in the CSG-DBR region B. The tunable LD 100 may emit light with a wavelength at which one of the gain peaks coincides with one of the reflection peaks.

Also, the controller 120 drives the TEC 110 so as to set the temperature thereof in the initial temperature $T_{LD}$. The temperature of the TEC 110 affects the equivalent refractive index of the segments SG4 in the SG-DFB region A. The supply of the initial heater currents, $I_{Heater\_A}$ to $I_{Heater\_C}$, to respective heaters, 10a to 10c, by the controller 120 influences the equivalent refractive index in respective segments, SG1 to SG3, in the CSG-DBR region B. The controller 120 further supplies the initial supply current $I_{SOA}$ to the electrode 21. According to the procedures done by the controller 120 described above, the optical transmitter 200 may emit light with the wavelength corresponding to the target channel and the preset power. The tunable LD 100 of the embodiment provides the CSG-DBR region B with plural types of segments each showing the envelope of the reflection peaks dependent on the wavelength. Accordingly, the tunable LD 100 may emit light with a wide wavelength range wholly covering all grids/channels in the dense wavelength division multiplexing (DWDM) standard.

The control of the temperatures by three heaters, 10a to 10c, will be described. Varying the temperatures of the segments, SG1 to SG2, by respective heaters, 10a to 10c, the equivalent refractive indices of the segments, SG1 to SG3, are modified, which means that the longitudinal mode of the laser oscillation may be selected. The controller 120 adjusts the temperatures of the segments, SG1 to SG3, such that the effective refractive indices, n1 to n3, of the segments, SG1 to SG3, satisfy the relation of:

$$n1 = n3 + (n2 - n3) \times K, \quad (2)$$

where K is a constant in a range of 0.3=<K<=0.7, which reflects the physical dimensions (lengths) of the segments, SG1 to SG3.

When the parameter K is 0.5 as an example, the effective refractive index n1 of the first segment SG1 becomes:

$$n1 = n3 + (n2 - n3) \times 0.5 = (n2 + n3)/2.$$

That is, the controller 120 controls the equivalent refractive index n1 of the first segment SG1 becomes an average of the refractive indices, n2 and n3, of the rest segments, SG2 and SG3. Explanations below assume that K is equal to 0.5.

Variations of the equivalent refractive indices, n1 to n3, of respective segments, SG1 to SG3, are proportional to variations of the temperatures in respective segments, SG1 to SG3, in the first approximation. Moreover, the variation of the temperature of the segment may be determined by a product of the electrical power supplied to the heaters and the thermal efficiency (Thermal resistance) of the heaters. Setting the power supplied to respective heaters and the thermal resistance thereof to be P1 to P3 and Rth1 to Rth3, respectively; the controller 120 controls the power supplied to the heaters, 10a to 10c, as follows:

$$P1 \cdot Rth1 = P3 \cdot Rth3 + (P2 \cdot Rth2 - P3 \cdot Rth3)/2 \quad (3)$$
$$= (P2 \cdot Rth2 + P3 \cdot Rth3)/2.$$

Figure 3:
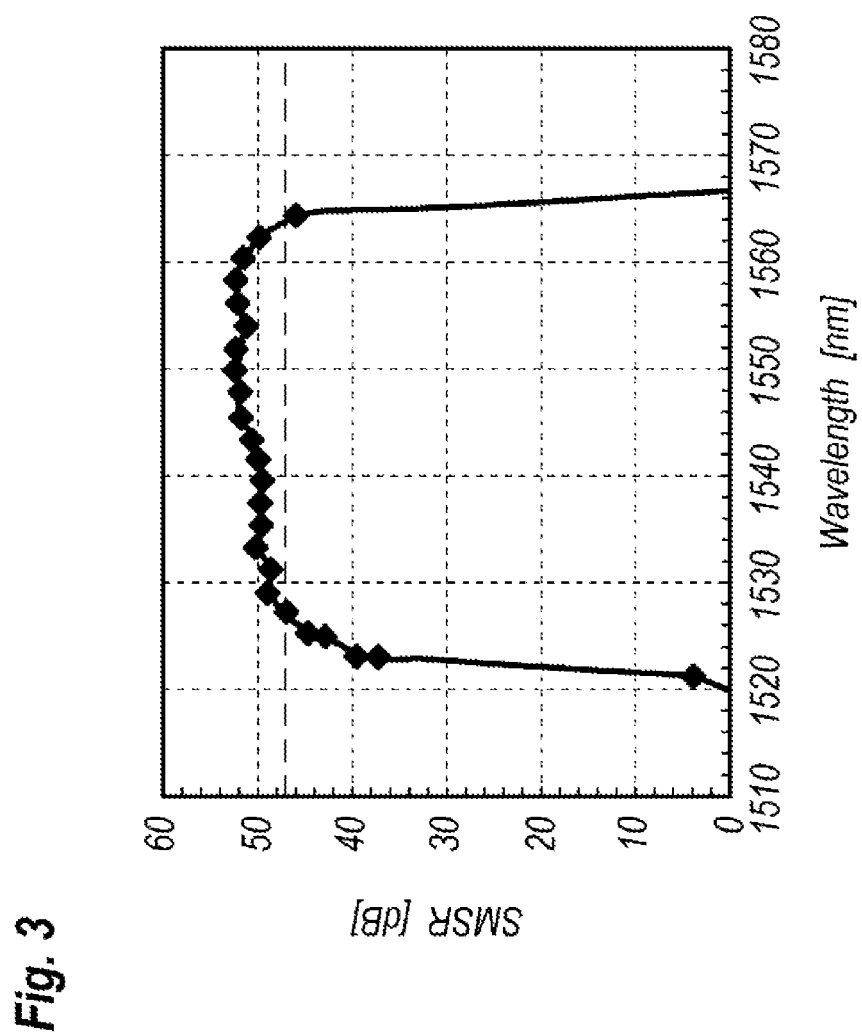
FIG. 3 shows a behavior of the maximum side mode suppression ratio (SMSR) against the emission wavelength of the tunable LD.

FIG. 3 shows a behavior of the side mode suppression ratio (SMSR) at respective emission wavelengths as varying the power supplied to the heaters, 10a to 10c, under the condition following the equation (3). Specifically, varying the power supplied to two heaters, 10b and 10c, and adjusting the power supplied to the first heater 10a so as to satisfy the equation (3), namely, $$P1 = (P2 \cdot Rth2 + P3 \cdot Rth3)/2/Rth1,$$

the emission wavelength and the SMSR are evaluated. A combination of the power, P1 to P3, under which the SMSR becomes the maximum is the operating condition of the heaters, 10a to 10c, at the wavelength.

However, in a practical tunable LD 100, or under a practical operation of the tunable LD 100, respective segments, SG1 to SG3, probably deviates the length thereof less than a period of the corrugation of the diffraction grating due to, for instance, the instability of the manufacturing process of the corrugation and/or stress caused during an assembly thereof, which results in the phase mismatching between segments, SG1 to SG3. Specifically, equation (1) should be revised to:

$$L1 = L3 + (L2 - L3) \cdot K + L0,$$

where L0 collectively denotes the deviation of the lengths of the segments, SG1 to SG3. Even when the controller 120 supplies the power, P1 to P3, satisfying the relation (3); the emission wavelength of the tunable LD 100 becomes instable because the existence of the deviation parameter L0 causes the phase mismatching between the segments, SG1 to SG3.

In the present embodiment, the heaters, 10a to 10c, or the equivalent index of respective segments, SG1 to SG3, are adjusted by the controller 120 as follows:

$$n1=n3+(n2-n3)\times K+\text{offset}(\neq 0). \quad (4)$$

The offset is set so as to widen the range of the emission wavelength of the tunable LD 100. Setting the offset, the laser oscillation may be stabilized even when the optical lengths of the segments deviate from the designed one. The LUT 130 may store the offset or parameters to derive the offset.

Because the equivalent refractive index of a semiconductor material depends on a temperature thereof, the controller 120 may control the temperature instead of the refractive index. For instance, assuming T1 to T3 are temperatures of respective segments, SG1 to SG3, the controller 120 may control respective heaters, 10a to 10c so as to satisfy the relation of:

$$T1=T1+(T2-T3)\times K+\text{offset}(\neq 0). \quad (5)$$

Still another viewpoint, the temperatures of respective segments, SG1 to SG3, are dependent on or proportional to power supplied to respective heaters, 10a to 10c. Assuming the power to respective heaters, 10a to 10c, are P1 to P3 and thermal resistance of the heaters, 10a to 10c, are Rth1 to Rth3; the controller 120 may supply the power to respective heaters, 10a to 10c, by a relation of:

$$P1\times Rth1 = P3 \times Rth3 + (P2 \times Rth2 - P3 \times Rth3) \times K + \text{offset}(\neq 0). \quad (6)$$

The offset appearing in equations, (4) to (6), may be determined in advance to the practical operation of the tunable LD 100. Specifically, the tunable LD 100 is practically operated under various offset conditions; and the condition where the side mode suppression ratio (SMSR) becomes a maximum is preferably selected as the offset. Next, details of the determination of the offset will be described as varying the power supplied to the heaters, 10a to 10c.

Figure 4:
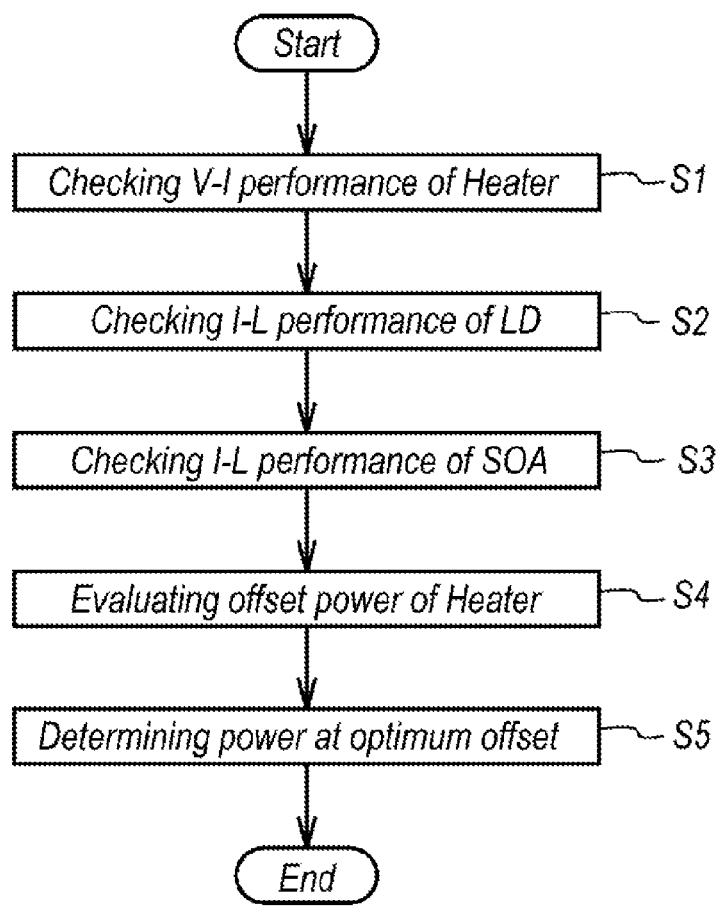
FIG. 4 shows a procedure to an optimum offset power supplied to a heater in a specific segment.

FIG. 4 shows a flow chart of the process to determine the offset. The process first checks the voltage-to-current characteristics of respective heaters, 10a to 10c, at step S1. Then, the SG-DFB region A is practically activated by the injection current and the optical output of the tunable LD 100 is verified at step S2. That is, the tunable LD 100 is checked to emit light, or induce the laser oscillation, by supplying a current to the electrode 8 in the SG-DFB region A. Next, the SOA region C is tested at step S3. Specifically, the output power of the tunable LD 100 is verified as varying a current supplied to the electrode 21 in the SOA region C.

The function to tune an emission wavelength is tested at step S4, which means that an optimum offset is evaluated or selected. Specifically, the SMSR and the emission wavelength are measured for various offsets, e.g. $\Delta P1=-22$ mW, $\Delta P2=-17$ mW, $\Delta P3=-11$ mW, $\Delta P4=-6$ mW, $\Delta P5=0$ mw, $\Delta P6=6$ mW, and $\Delta P7=11$ mW, as varying the power, P1 to P3, supplied to respective heaters, 10a and 10c, so as to satisfy the relation of:

$$P1=(P2 \cdot Rth2/Rth1+P3 \cdot Rth3/Rth1)/2+\Delta Pi (i=1 \text{ to } 7).$$

Figure 5:
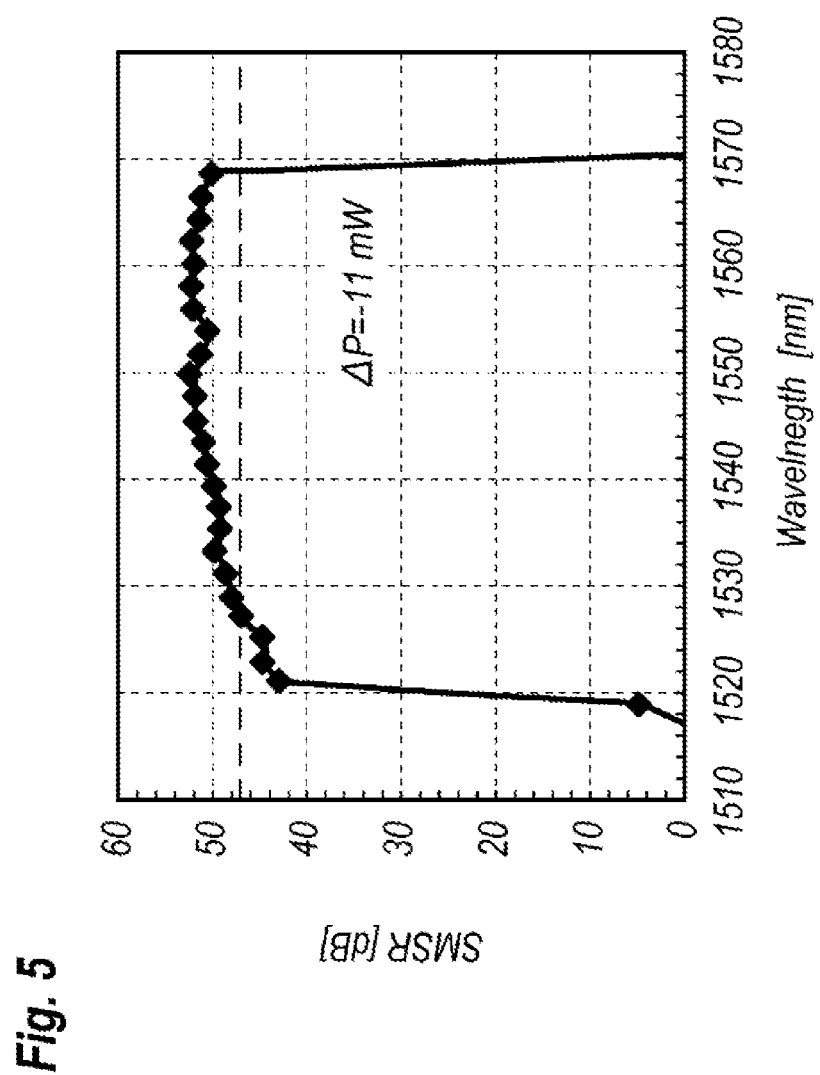
FIG. 5 shows a typical behavior of the maximum SMSR against the emission wavelength when offset power is added for the heater in the specific segment.

The emission wavelength and the SMSR depend on not only the power, P1 to P3, but the offset $\Delta Pi$. FIG. 5 shows an example of measured results of the SMSR where the offset is set to be $\Delta P=-11$ mW. Assuming that the tunable range of the emission wavelength is in a region where the SMSR exceeds 47 dB, the result shown in FIG. 5 shows the tunable range from 1527 nm to 1569 nm, namely, $\Delta\lambda=42$ nm may be obtained.

Figure 6:
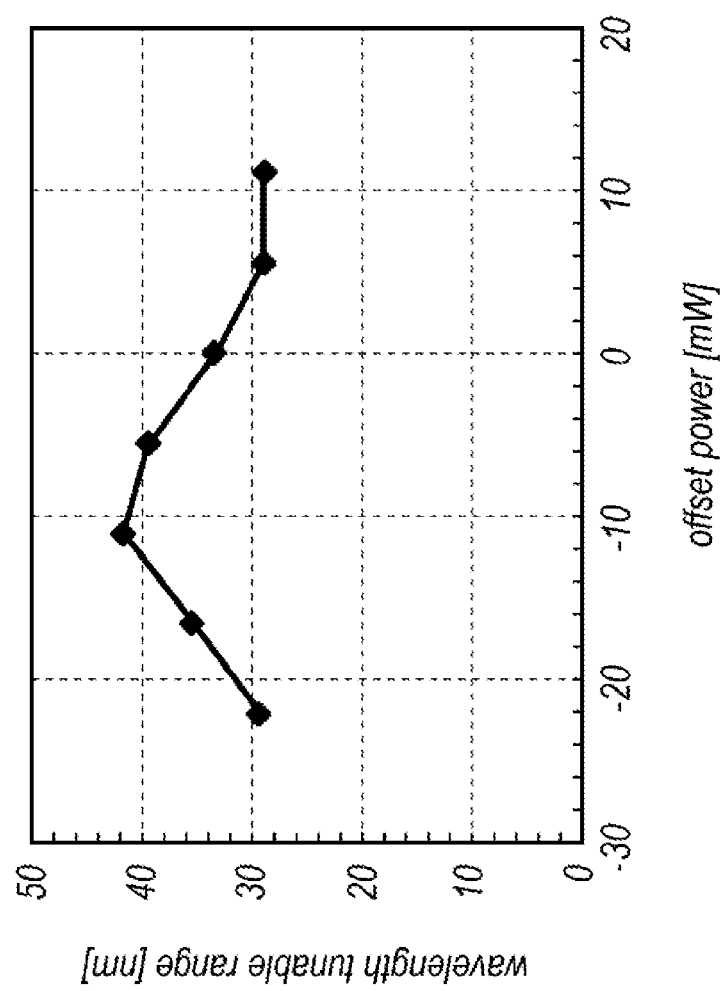
FIG. 6 shows a relation of the wavelength tunable range against the offset power.

Analyses similar to above are carried out for other offsets, $\Delta P1$ to $\Delta P2$ and $\Delta P4$ to $\Delta P7$. FIG. 6 shows a relation of the tunable range $\Delta\lambda$ against the offset. The exemplary result shown in FIG. 7 indicates that the maximum tunable range $\Delta\lambda=42$ nm is obtained for the offset of $\Delta P3=-11$ mW. Thus, the offset showing the maximum tunable range $\Delta\lambda$ may be decided as an optimum offset $\Delta P$opt.

Then, the power, P1 to P3, supplied to the heaters, 10a to 10c, is estimated by using the optimum offset $\Delta P$opt thus evaluated above at step S5. Specifically, in respective wavelengths, a combination of the power, P1 to P3, that satisfies the relation of:

$$P1=(P2 \cdot Rth2/Rth1+P3 \cdot Rth3/Rth1)/2+\Delta P\text{opt},$$

and the SMSR becomes a maximum is decided as the operating points at respective emission wavelengths.

When the maximum SMSR is evaluated as varying the combination of the power, P2 and P3, this process to evaluate the maximum SMSR automatically compensates the phase mismatching of the corrugations between the segment SG2 and the segment SG3. The operating points of the power, P2 and P3, that give the maximum SMSR is the point where the interaction between the segments, SG2 and SG3, becomes the maximum. However, when the analysis ignores the offset $\Delta P$, the interaction between the first segment SG1 and the second segment SG2 and/or between the first segment SG1 and third the segment SG3 is relaxed when the phases of the corrugations in respective segments deviate.

In the present embodiment, which takes the offset into account, the power supplied to the first heater P1 is given by the equation of:

$$P1=(P2 \cdot Rth2/Rth1+P3 \cdot Rth3/Rth1)/2+\Delta P\text{opt},$$

that is the power supplied to the first heater 10a is adjusted to compensate the phase mismatching of the corrugations between the first and second segments, SG1 and SG2, and between the first and third segment, SG1 and SG3; because the offset $\Delta P$opt is determined so as to set the wavelength tunable range maximum, which means that the offset makes the interaction between the segments maximum.

Thus, the control of the power P1 supplied to the heater 10a in the first segment SG1 taking the offset $\Delta P$opt into account may effectively suppress the side mode possibly appearing in the CSG-DBR region B caused by the phase deviation less than the period of the corrugation of the diffraction grating 18 due to, for instance, the instability of the process to form the corrugation and/or the stress induced during the assembling process of the device.

Second Embodiment

When the thermal resistance, Rth1 to Rth3, of the heaters, 10a to 10c, shifts from the designed value due to, for instance, deviations in a width and/or a thickness thereof by the instability of the process to form the heaters, 10a to 10c; the temperatures of the segments, SG1 to SG3, are unable to be set in the designed one even when the predetermined power, P1 to P3, are supplied to the respective heaters, 10a to 10c, which means that the desired equivalent refractive indices are not realized in the segments, SG1 to SG3. Resultantly, the interaction between the segments, SG1 to SG3, becomes weakened and the laser oscillation falls in unstable.

The control method of the present embodiment supplies the power P1 to the first heater 10a so as to satisfy the following equation:

$$P1=P3 \cdot Rth3/Rth1+(P2 \cdot Rth2/Rth1-P3 \cdot Rth3/Rth1) \cdot K \cdot (1+Kp), \quad (7)$$

where P1 to P3, Rth1 to Rth3, K and Kp are the power supplied to respective heaters, 10a to 10c, the thermal resistance of the heaters, 10a to 10c, the constant reflecting physical dimensions (or the length) of the heaters, 10a to 10c, and the power correction factor.

The power correction factor Kp stabilizes the laser oscillation of the tunable LD 100 even when respective heaters, 10a to 10c, in the thermal resistance or the thermal efficiency thereof deviate from the designed one. Similar to the aforementioned factor, the LUT 130 may store the power correction factor Kp itself, or parameters to calculate the power correction factor Kp.

Figure 7:
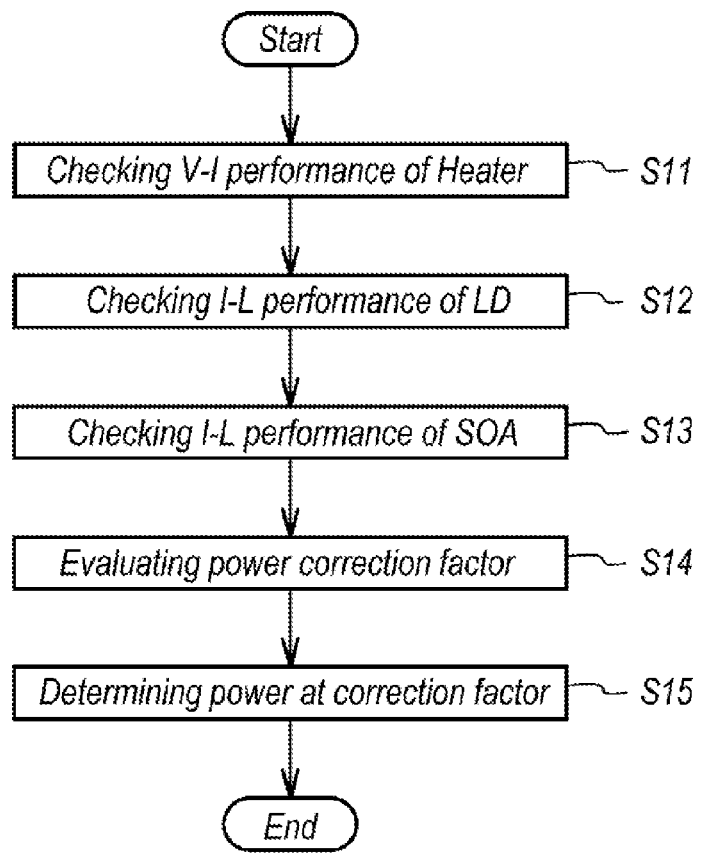
FIG. 7 shows a procedure to obtain an optimum power correction factor.

Next, an algorithm to determine the optimum power correction factor will be described. FIG. 7 is a flowchart to evaluate the optimum power correction factor Kpopt. Steps from S11 to S13 in this algorithm are same as those in the aforementioned flowchart shown in FIG. 4. The algorithm next estimates the optimum power correction factor at step S14. Specifically, considering a plurality of the power correction factors Kp(i), i=1 to n, for instance, Kp1=−0.20, Kp2=−0.15, Kp3=−0.10, Kp4=−0.05, Kp5=0.0, Kp6=0.05, and Kp7=0.10, are assumed.

Then, for respective power correction factors, Kp1 to Kp7, the power P1 for the first segment SG1 is set so as to satisfy the relation of:

$$P1=(P2\cdot Rth2/Rth1+P3\cdot Rth3/Rth1)\times 0.5\times(1+Kp(i)),$$

for various combinations of the power, P2 and P3, to the second and third segments, SG2 and SG3; and the oscillation wavelength λ and the SMSR are practically measured.

Figure 8:
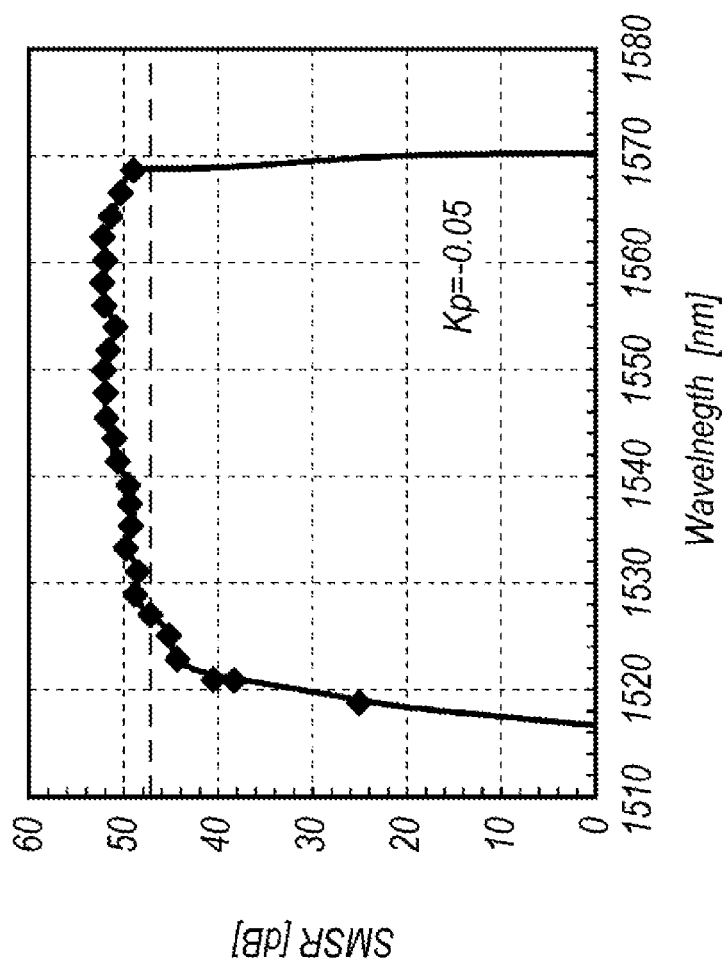
FIG. 8 shows a typical behavior of the maximum SMSR against the emission wavelength when a power correction factor of Kp=0.05 is set.

FIG. 8 shows an example of the SMSR against the wavelength for the power correction factor of Kp=−0.05. Varying the power, P1 to P3, not only the oscillation wavelength but the SMSR are varied. Two combinations possibly cause the oscillation wavelengths overlapping with or substantially equal to each other. The behavior shown in FIG. 8 connects the maximum SMSR for respective oscillation wavelengths. The analysis below assumes that the wavelength tunable range is given by wavelengths the SMSR exceeds 47 dB. The behavior shown in FIG. 9, which corresponds to the power correction factor Kp of −0.05 gives the wavelength tunable range of 42 nm (1569 nm-1527 nm).

Figure 9:
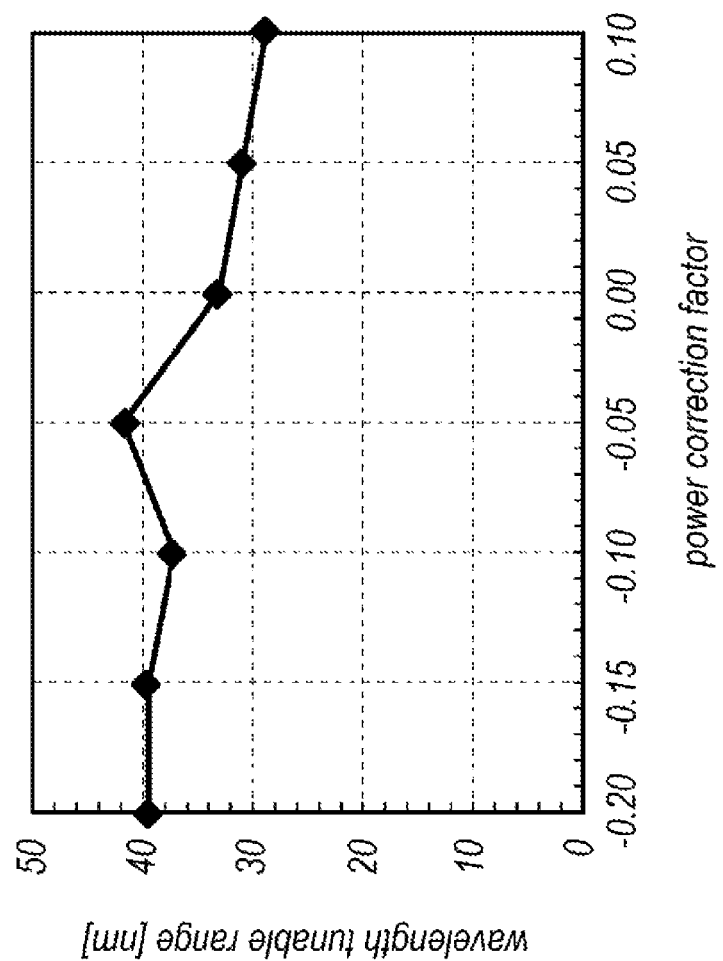
FIG. 9 shows a relation of the wavelength tunable range against the power correction factor.

FIG. 9 shows the wavelength tunable ranges for various power correction factors Kp(i), where respective ranges are obtained by the procedures described above. In FIG. 9, the power correction factor of Kp4=−0.05 gives the maximum wavelength tunable range of 42 nm. Then, the LUT 130 holds the power correction factor Kp thus evaluated as an optimum correction factor $Kp_{opt}$.

Next, using the optimum correction factor $Kp_{opt}$ determined in step S14, combinations of the power, P1 to P3, are determined for respective emission wavelengths so as to set the SMSR maximum, and stored in the LUT 130 as the operating point of the power, P1 to P3, for the emission wavelength. The power, P1 to P3, satisfies the relation of:

$$P1=(P2\cdot Rth2/Rth1+P3\cdot Rth3/Rth1)/2\times(1+Kp_{opt})$$

As described, when one combination of the power, P2 and P3, to get the maximum SMSR at a wavelength is evaluated as varying the values thereof, the combination automatically compensates the deviation from the designed thermal efficiency of the heaters, because the maximum SMSR occurs when two segments, SG2 and SG3, show the maximum interaction. The thermal efficiency of the heaters, 10b and 10c, due to the deviations of the physical dimensions thereof caused by the process instability is inevitably corrected by selecting respective power to get the maximum SMSR.

For the rest heater 10a, when the thermal efficiency of the heaters, 10a to 10c, reflects the designed efficiency, the interaction between the segments, SG1 and SG2, and between the segments, SG1 and SG3, may be a maximum. However, when the thermal efficiency of the heaters, 10a to 10c, deviates from the designed one, the interaction between the segments is weakened without any correction factors.

The present method to control the heaters sets the correction factor $Kp_{opt}$ for the power P1 supplied to the heater 10a in the first segment SG1. The correction factor $Kp_{opt}$ is determined so as to set the wavelength tunable range widest, which means that the interaction between the segments becomes strongest. Thus, the power correction factor $Kp_{opt}$ effectively compensates the deviation of the thermal efficiency of the heaters, 10a to 10c, from respective designed values.

The tunable LD 100 shown in FIG. 2 preferably provides the first segment SG1 closer to the SG-DFB region A compared with rest segments, SG2 and SG3, because the correction factor above described compensates the power P1 supplied to the first heater 10a, and the first segment SG1, when arranged closest to the SG-DFB region A, couples with the SG-DFB region A in strongest, which effectively enhances the SMSR.

In the foregoing detailed description, the method of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method to control an optical transmitter that provides a wavelength tunable laser diode (tunable LD), a controller, and a memory look-up-table (LUT), the tunable LD integrally having a sampled grating distributed feedback (SG-DFB) region and a chirped sampled grating distributed Bragg reflector (CSG-DBR) region including at least three segments each having a diffraction grating and a space neighbor to the diffraction grating, each of segments having a heater and an optical length satisfying a relation of:

$$L1=L3+(L3-L2)\cdot K,$$

where L1 to L3 are respective optical lengths and K is a constant of 0.3<=K<=0.7, the method comprising steps of:
  evaluating parameters to define an emission wavelength of the tunable LD, the parameters including currents supplied to respective heaters, optimum offset power supplied to the heater in the first segment, and an operating temperature of the tunable LD;
  storing the parameters to the memory LUT; and
  practically operating the tunable LD by performing steps of,
    receiving a target emission wavelength at which the tunable LD emit laser light,
    reading parameters corresponding to the target emission wavelength from the memory LUT, and
    controlling respective elements based on the parameters,
  wherein the step of evaluating the parameters includes steps of,
  varying power, P1 to P3, supplied to respective heaters based a relation of, $$P1=P3\cdot Rth3/Rth1+(P2\cdot Rth2/Rth1-P3\cdot Rth3/Rth1)+\text{offset},$$

where Rth1 to Rth3 are thermal resistance of respective heaters and offset is offset power supplied to the heater in the first segment;

measuring an emission wavelength and a side mode suppression ratio (SMSR) at the emission wavelength for the offset power;

evaluating a wavelength tunable range of the tunable LD, where the wavelength tunable range is a range the SMSR exceeds a preset value;

iterating the steps of varying power, measuring the emission wavelength and the SMSR, and the evaluating the wavelength tunable range as varying the offset;

determining the optimum offset power at which the wavelength tunable range becomes a maximum.

2. The method of claim 1, wherein the step of evaluating the parameters further includes steps of:

measuring the emission wavelength as varying the power, P1 to P3, supplied to the heaters under the relation of:

$$P1 = P3 \cdot Rth3/Rth1 + (P2 \cdot Rth2/Rth1 - P3 \cdot Rth3/Rth1) + \text{optimum\_offset};$$

storing the parameters of P1 to P3, the optimum_offset as the optimum offset power, and the emission wavelength in the memory LUT.

3. The method of claim 2, wherein the tunable LD further includes a sampled grating distributed feedback (SG-DFB) region neighbor to the CSG-DBR region, the SG-DFB region interacting with the CSG-DBR region to determine the emission wavelength of the tunable LD, wherein the first segment in the CSG-DBR region is provided closest to the SG-DFB region compared with the second segment and the third segment.

4. The method of claim 3, wherein the CSG-DBR region provides a first number of the first segments, a second number of the second segments, and a third number of the third segments, the first number being greater than an average of the second number and the third number.

5. The method of claim 3, wherein the tunable LD further includes a semiconductor optical amplifier (SOA) region to amplify light generated in the SG-DFB region, and wherein the step of evaluating parameters further includes steps of:

determining a current supplied to the SOA region for obtaining preset power of the laser light output from the tunable LD, and storing the current to the memory LUT.

* * * * *